United States Patent
Von Mansberg et al.

(10) Patent No.: US 12,452,618 B2
(45) Date of Patent: Oct. 21, 2025

(54) ELECTRONIC MODULE FOR A HEARING INSTRUMENT TO BE WORN IN THE EAR CANAL AND HEARING INSTRUMENT TO BE WORN IN THE EAR CANAL

(71) Applicant: Sivantos Pte. Ltd., Singapore (SG)

(72) Inventors: Thilo Von Mansberg, Erlangen (DE); Marco Steffen, Löhne (DE); Alexander Menke, Löhne (DE)

(73) Assignee: Sivantos Pte. Ltd., Singapore (SG)

( * ) Notice: Subject to any disclaimer, the term of this patent is extended or adjusted under 35 U.S.C. 154(b) by 182 days.

(21) Appl. No.: 18/339,416

(22) Filed: Jun. 22, 2023

(65) Prior Publication Data

US 2024/0007806 A1    Jan. 4, 2024

(30) Foreign Application Priority Data

Jun. 30, 2022   (DE) ...................... 10 2022 206 737.1

(51) Int. Cl.
*H04R 25/00*        (2006.01)

(52) U.S. Cl.
CPC ......... *H04R 25/609* (2019.05); *H04R 25/602* (2013.01); *H04R 2225/025* (2013.01); *H04R 2225/31* (2013.01); *H04R 2225/57* (2019.05)

(58) Field of Classification Search
CPC ................ H04R 25/609; H04R 25/602; H04R 2225/025; H04R 2225/31; H04R 2225/57; H05K 1/189
USPC .................................. 381/312, 323, 324, 328
See application file for complete search history.

(56) References Cited

U.S. PATENT DOCUMENTS

| | | | |
|---|---|---|---|
| 9,014,407 B2 | 4/2015 | Boguslavskij et al. |
| 11,758,340 B2 | 9/2023 | Zhang |
| 2014/0348362 A1 | 11/2014 | Helgeson et al. |
| 2021/0306730 A1 | 9/2021 | Knudsen |

FOREIGN PATENT DOCUMENTS

| | | |
|---|---|---|
| CN | 113015075 A | 6/2021 |
| DE | 102012214466 A1 | 12/2013 |
| DE | 102017012195 A1 | 12/2018 |

*Primary Examiner* — George C Monikang
(74) *Attorney, Agent, or Firm* — Laurence A. Greenberg; Werner H. Stemer; Ralph E. Locher

(57) ABSTRACT

An electronic module for a hearing instrument to be worn in the ear canal has a rechargeable battery, a circuit carrier, and a chipset arranged on the circuit carrier and forming an audio processor, and power management electronics. The circuit carrier is strip-shaped and, in the intended assembly state, is wrapped, in sections and bent, around the rechargeable battery in such a way that the rechargeable battery is at least partially arranged between the audio processor and the power management electronics.

8 Claims, 7 Drawing Sheets

ELECTRONIC MODULE FOR A HEARING INSTRUMENT TO BE WORN IN THE EAR CANAL AND HEARING INSTRUMENT TO BE WORN IN THE EAR CANAL

FIELD AND BACKGROUND OF THE INVENTION

The invention relates to an electronic module for a hearing instrument to be worn in the ear canal. Furthermore, the invention relates to such a hearing instrument to be worn in the ear canal.

Hearing instruments are typically used to output a sound signal to the ear of the wearer of said hearing device. The output takes place by means of an output transducer, usually acoustically via airborne sound, by means of a loudspeaker (also referred to as "earpiece" or "receiver"). Such hearing instruments are often used as so-called hearing aid devices (also "hearing aids" for short). For this purpose, the hearing instruments usually comprise an acoustic input transducer (in particular a microphone) and a signal processor that is configured to process the input signal (i.e. microphone signal) generated by the input transducer from the ambient sound, by applying at least one signal processing algorithm, usually stored in a user-specific manner, in such a way as to at least partially compensate for a hearing loss of the wearer of the hearing instrument. In particular, in the case of a hearing aid device, the output transducer, in addition to a loudspeaker, may alternatively be a so-called bone-conduction earphone or a coch-lear implant, which is configured to couple the audio signal mechanically or electrically into the ear of the wearer. The term "hearing instrument" additionally includes in particular devices such as so-called tinnitus masks, headsets, head-phones, and the like.

Typical designs of hearing instruments, especially hearing aids, include behind-the-ear ("BTE") and in-the-ear ("ITE") hearing instruments. These designations refer to the intended wearing position. For example, behind-the-ear hearing instruments have a (main) housing that is worn behind the outer ear. A distinction may be made here between models having a loudspeaker arranged in this housing, in which the sound is usually emitted to the ear by means of a sound tube worn in the ear canal, and models that comprise an external loudspeaker placed in the ear canal. On the other hand, in-the-ear hearing instruments comprise a housing that is worn inside the outer ear or even completely inside the ear canal.

ITE hearing instruments (also abbreviated to "ITEs") usually also have different characteristics, namely models that are worn completely "recessed" in the ear canal (also referred to as "CIC" for "completely in canal"), and models that are partially recessed in the ear canal and partially exposed in the outer ear.

The power supply for the electrical and electronic components, in particular the signal processor, microphone, and loudspeaker, is increasingly provided by secondary cells, i.e. rechargeable batteries. The problem with respect to ITEs is that secondary cells, if they are to remain permanently installed in the hearing instrument so that they do not have to be replaced in a similar way to conventional battery cells, require a power management system which, on the one hand, monitors the state of charge of the secondary cell, controls the supply of charging power to the secondary cell during a charging process, and controls the distribution of power to the electrical and electronic components during operation. In addition, means for receiving the charging power, i.e. in particular at least two contacts at different electrical potentials, are required. As is known, these necessary components require installation space, which is only available to a limited extent in ITEs in particular, especially CICs.

The limited installation space available must therefore be used as efficiently as possible. However, it is also problematic that electromagnetic interference fields can occur between the signal processor and power management and/or charging contacts, which must be avoided (also often referred to as electromagnetic compatibility). In addition, the respective components must also be stored mechanically.

SUMMARY OF THE INVENTION

The object of the invention is to enable an improved ITE hearing instrument.

This object is achieved according to the invention by an electronic module as claimed. Furthermore, this object is achieved according to the invention by a hearing instrument as claimed. Further advantageous embodiments and further developments of the invention, some of which are inventive per se, are explained in greater detail in the subclaims and in the following description.

The electronic module according to the invention is configured and intended for use in a hearing instrument to be worn in the ear canal (hereinafter referred to as "ITE" for short). The electronic module has a rechargeable battery and preferably a purely mechanical holder (in particular one that performs no electrical functions) in which the rechargeable battery is accommodated when the electronic module is in the intended assembly state. Furthermore, the electronic module has a circuit carrier (in particular a circuit board, preferably a printed circuit board (PCB)). Preferably, the electronic module has a microphone arranged on the circuit carrier. In addition, the electronic module has a chipset arranged on the circuit carrier that forms an audio processor and power management electronics for the ITE. The circuit carrier is formed in a strip-shaped manner and without substantial tapering between two adjacent strip sections and, in the intended assembly state, is wrapped, in sections and bent, around the mechanical holder in such a way that the rechargeable battery is at least partially arranged between the audio processor and the power management electronics. In other words, the PCB is bent and encompasses the battery in such a way that said battery is arranged on a kind of chord (in the sense of an arc chord, even if the PCB is not bent in an arc-shaped manner) between the audio processor and the power management electronics.

In this context, "strip-shaped and without substantial tapering between two adjacent strip sections" is understood to mean in particular that the circuit carrier has the form of a strip (in particular longer than wide and preferably with parallel longitudinal edges). This tapering between the two strip sections of the circuit carrier which follow each other in the strip direction, and on which electrical and/or electronic components are arranged, and which have the same strip width or at least a similar strip width with a difference of less than 40 percent, is only less than 20 percent narrower than the strip width of these strips, at least the narrower one. Such a taper is provided in particular only for better bendability, in particular in order to be able to provide the greatest possible width for guiding conductive tracks. A secondary strip section, which may also be present, and which is connected to one of the strip sections only on one side, in particular laterally, and the strip width of which is narrower than 60 percent of this adjacent strip section, is preferably connected to this adjacent strip section with a taper which is narrower by a maximum of 20 percent than the secondary strip section.

The mechanical holder is optionally also referred to as "frame" or "electronics frame" in the following, since said holder is used to hold at least a portion of the electrical and electronic components of the hearing instrument, in any case of the electronic module, as described above.

The term "chipset" is understood here and in the following to mean in particular an interconnection of several electronic components, preferably including integrated circuits, for example in the form of microprocessors and/or ASICs. The audio processor is preferably configured to process audio signals, for example signals generated by means of the microphone on the basis of received airborne sound, in a user-specific manner and, in the case of a hearing aid device, to filter and/or amplify said audio signals in particular as a function of frequency.

Due to the fact that the PCB is wrapped around the holder and the battery is held therein, a compact design is advantageously made possible, in particular because batteries, even rechargeable ones, often have smaller dimensions than PCBs assembled for use in hearing instruments. This allows the PCB to be at least roughly matched to the contour of the battery, which in turn enables better utilization of space. In addition, due to the placement of the battery between the audio processor and power management electronics, said battery can provide an electromagnetic shielding effect, thus improving the electromagnetic compatibility of the audio processor. As a result, in particular interference in the audio processor caused by charging currents, at least from the power management electronics to the battery, is prevented or reduced.

The power management electronics are preferably configured to supply charging power to the rechargeable battery during a charging process, and to supply operating power from the rechargeable battery to at least the audio processor during intended operation of the ITE. Preferably, the power management electronics comprise at least one chip for this purpose, in the form of a so-called power management integrated circuit (PMIC).

Preferably, the mechanical holder is configured in a clamp-like manner. In the intended assembly state, the holder partially encompasses the rechargeable battery on the circumference and is held in the closing direction by means of the PCB, in particular prevented from bending open. Preferably, the holder is loaded in such a way that a clamping force is exerted or increased on the battery. Thus, the battery is advantageously held in a force-locked manner, thus simplifying handling of the electronic module during the assembly of the ITE.

In an advantageous embodiment, the mechanical holder is essentially annular with an annular opening, in particular approximately C-shaped, and has a hooking structure on an outer side facing away from the annular opening. The PCB has a hook structure corresponding to the hooking structure, by means of which the PCB is hooked into the hook structure. For example, the hooking structure of the holder is in the form of a hook-like undercut in the outer surface of the holder. Interlocking allows comparatively easy handling during assembly, since the corresponding structures generally only need to be pushed into each other.

In an advantageous further embodiment, the PCB is arranged running over the annular opening of the (mechanical) holder (i.e. extending across the annular opening). In addition, the PCB is fixed to the mechanical holder on the side of the annular opening opposite the hooking structure. Preferably, the PCB is glued at this point. In principle, hooking is also possible here. However, in order to be able to easily form the bracing described above, gluing is advantageous, since mechanical locking requires comparatively narrow production tolerances for precise positioning in the circumferential direction, which in turn can be adjusted by means of gluing.

To form the hook structure of the PCB, an end section of the PCB is preferably folded over.

In particular, the PCB has a first end region in which the audio processor described above is also arranged, a center region delimited from the first end region in the longitudinal direction of the strip, and a second end region that is adjacent to the center region and opposite the first end region. The folded-over end section is preferably arranged in the first end region.

In particular, the PCB is angled at the respective transition between the first end region to the center region, and between the center region and the second end region, and is wrapped in sections (in particular with otherwise straight sections) around the mechanical holder holding the battery.

In particular, the end section is glued to an adjacent portion of the PCB, in particular of the first end region. To enable hooking with the hooking structure, a hooking region, which is formed in particular by one edge strip of each of the strip-shaped PCBs, advantageously remains free of adhesive. In this hooking region, specifically in this edge strip, advantageously, no electrical components are applied to the PCB.

Accordingly, the hooking structure is preferably formed by two webs projecting from the mechanical holder but facing away from the annular opening, under which the PCB is inserted with its hooking region, in particular with the respective edge strip.

Between the aforementioned end section and the subsection (in particular of the first end region of the PCB) lies at least one chip, which preferably forms the audio processor or at least a portion thereof. The height of the chip defines a mini-mum distance between the end section and the subsection. Preferably, two chips that together form the "core" of the audio processor lie between these sections. Preferably, one chip is arranged at the end section and the other chip at the subsection, so that they lie between these sections when the PCB is folded "back to back". Preferably, therefore, the total height of the two chips (plus an extra amount for an adhesive layer, if applicable) determines the distance between the two sections.

The power management electronics are preferably arranged in the center region of the PCB. In particular, the aforementioned microphone is also arranged in the center region, preferably on a side of the PCB facing the rechargeable battery. The microphone is associated with an opening ("sound hole") in the PCB that is aligned with a sound inlet opening of the microphone. The microphone is also advantageously located closer to the folded-over end section (i.e. the first end region) than the power management electronics. In other words, the power management electronics are arranged in a section of the center region facing the second end region. This allows as much space as possible to be placed between the audio processor and the power management electronics, so that, in the bent state, the battery can be arranged as easily as possible and with as large a section as possible between the power management electronics and the audio processor. In particular, the power management electronics are arranged in particular in a closest section of the center region facing the second end region.

In an advantageous refinement of the arrangement of the power management electronics described above in the center region, the PMIC thereof described above is preferably positioned in the center region in such a way that, in the intended (final) assembly state, it is "shaded" by the battery with respect to the audio processor, in particular one or more chips of the audio processor. In particular, the battery thus covers straight lines of connection (i.e., imaginary "rays") between the PMIC and the chips.

In another advantageous embodiment, at least one contact strip (secondary strip section) of the PCB with contacting points (in particular solder pads) for at least one further electronic component projects from the end section or the subsection (of the first end section) beyond a folded edge (i.e. the edge around which the end section is folded over) between the end section and the main section. This (or the respective) contact strip is formed in particular by a longitudinal slot which separates the contact strip from the end section or the subsection in the longitudinal direction, and leaves it in contact with the subsection or the end section at the end (in the region of the folding edge), so that when the end section is folded over, this contact strip is "erected," specifically, not folded over with it, and projects beyond the folding edge in an extension to the subsection or the end section.

The electronic component that is electrically connected to the contact section (contact strip) in the intended final assembly state of the ITE is a receiver (loudspeaker) and/or an "MI antenna", specifically an induction coil that is configured for wireless, magnetic-inductive signal transmission.

In another advantageous embodiment, the mechanical holder has laterally projecting first and second positioning aids, particularly in end regions (or edge regions) on both sides of the annular opening. In this context, "laterally projecting" is understood to mean in particular that these positioning aids project in the direction of an annular axis. These positioning aids are engaged with corresponding first and second positioning aids of a housing element of the hearing instrument for mutual positioning, in an intended assembly state of the ITE.

In particular, the first and second positioning aids of the mechanical holder are formed as pins. The corresponding positioning aids of the housing element are preferably formed as recesses, optionally holes, but in particular as grooves or clamp-like recesses, into which the pins can be inserted transversely to the pin axis in each case.

In another advantageous embodiment, the mechanical holder includes a bolting eye (i.e., a hole) for receiving a locking pin for connecting the mechanical holder to at least the housing element. The first and second positioning aids are preferably configured to keep the bolting eye congruent with a corresponding hole in the housing element of the hearing instrument, in an intermediate assembly step. For this purpose, the corresponding positioning aids in the housing element are preferably configured in such a way that the mechanical holder is held in two spatial directions set at an angle to each other (greater than zero and less than 180 degrees). This can effectively prevent the electronic module attached to the housing element, in particular at least the mechanical holder, from being dis-placed, at least apart from a play within and due to usual tolerances.

In a preferred embodiment, the electronic module comprises a charging contact arrangement for charging the rechargeable battery. This charging contact arrangement is arranged on the PCB on a side facing away from the rechargeable battery. Preferably, the charging contact arrangement comprises two charging contacts assigned to different electrical potentials.

The charging contact arrangement is preferably arranged in the second end region of the PCB, and thus at the end of the PCB opposite the folded-over end section. In particular, the charging contact arrangement is thus arranged across the rechargeable battery, opposite the audio processor. This enables a power flow, in particular a current flow, which is also advantageous with respect to the aforementioned EMC aspects. This is because during a charging process, current advantageously first flows from the charging contact arrangement to the power management electronics which are arranged in the adjacent center region (and in particular also adjacent to the charging contact arrangement), and which convert (transform) the (charging) current as necessary and supply it to the battery. In the intended operation of the ITE, on the other hand, operating power (i.e., in particular current) flows from the battery via the power management electronics to the microphone, which is preferably arranged adjacently, and further to the first end region, specifically to the signal processor arranged there.

A basic hearing instrument module (basic module for short) forming an independent invention is arranged and provided for use with the aforementioned ITE. The basic module comprises the electronic module described above and the housing element of the ITE addressed above. The housing element has at least one microphone opening. Furthermore, the housing element is attached to the electronic module in such a way that the microphone of the electronic module is in fluid connection with the environment through the microphone opening, when the ITE is in its intended final state of production. In particular, the microphone opening is thus aligned with the corresponding aperture in the PCB associated with the microphone, as well as the sound inlet opening of the microphone.

Preferably, the electronic module has a ring seal that surrounds the microphone opening and is arranged between the PCB and the housing element. The electronic module is advantageously braced against the housing element by means of the respective first and second positioning aids (of the mechanical holder and of the housing element) under load from the ring seal. As a result, the sealing pressure is advantageously applied between the housing element and the electronic module.

In a preferred embodiment, the housing element is essentially L-shaped, having a long leg and a short leg set at approximately a right angle thereto (i.e. preferably between 75 and 110 degrees). The microphone opening is arranged in the long leg, preferably in a free end region of the long leg. In the intended final assembly state of the ITE, the long leg forms a housing closure facing the open end of the ear canal, classically also referred to as a "faceplate". A charging opening is arranged in the short leg, through which the charging contact arrangement is accessible. In the intended wearing state of the ITE, the short leg is preferably arranged approximately parallel to the ear canal wall and is thus not visible from the outer ear. Advantageously, a (further) ring seal surrounds charging opening and is interposed between the housing element and the PCB, in order to prevent the ingress of contaminants between the housing element and the PCB.

Preferably, the basic module, at least the housing element, is symmetrical with respect to the geometric outer structures, i.e. the structures that are visible from an outer side in the intended final assembly state and that are used for mechanical connection with other components of the ITE.

As a result, the basic module may be used in equal measure for "left" and "right" ITEs (i.e. ITEs intended to be worn in the left or right ear, respectively), so that the number of common parts can advantageously be increased during production.

The ITE according to the invention comprises the electronic module described above, in particular the basic module. Furthermore, the ITE comprises a main housing that has a housing opening facing away from the eardrum, in the intended wearing state. The electronic module or basic module is inserted into the main housing and advantageously closes this housing opening by means of the housing element. Preferably, the main housing has an attachment hole through which a locking pin (in particular the aforementioned locking pin) passes in such a way that said locking pin also passes through the hole of the housing element and the bolting eye of the mechanical holder, as a result of which three components are secured to one another by a common connecting element.

The above-described first and second positioning aids of the mechanical holder and of the housing element thus advantageously act to mechanically align and fix the electronic module to the housing element to form an intermediate assembly.

Preferably, the ITE also comprises the aforementioned receiver and/or MI antenna, which preferably form a common integrated assembly, and which are arranged in the main housing and contacted with the corresponding contact strip or the solder pads arranged thereon.

The basic module and the ITE therefore have the features resulting from the description of the electronic module, as well as the advantages resulting therefrom, in equal measure.

An assembly method for the electronic module, which also constitutes an independent invention, further for the basic module as well as the ITE, thus comprises the following steps (the description below is based on the components described above):

Providing the mechanical holder,
Providing the rechargeable battery,
Providing the PCB,
Providing the chipset and the arrangement thereof on the PCB,
Inserting the battery into the mechanical holder, and
Wrapping the PCB around and attaching it to the mechanical holder;

in addition (for forming the basic module) in particular:
Providing the housing element, and
Connecting the electronic module, preferably by engaging the respective first and second positioning aids with the housing element;

as well as (for forming the ITE):
Providing the (preferably side-dependent, i.e. the left or right) main housing,
Inserting the base module into the main housing, and
Fixing the base module in the main housing.

Here and in the following, the conjunction "and/or" is to be understood in particular in such a way that the features linked by means of this conjunction can be designed both together and as alternatives to one another.

An exemplary embodiment of the present invention is described below in greater detail with reference to a drawing. In the drawings:

BRIEF DESCRIPTION OF THE FIGURES

Corresponding parts are always given the same reference signs in all figures.

DETAILED DESCRIPTION OF THE INVENTION

Figure 1:
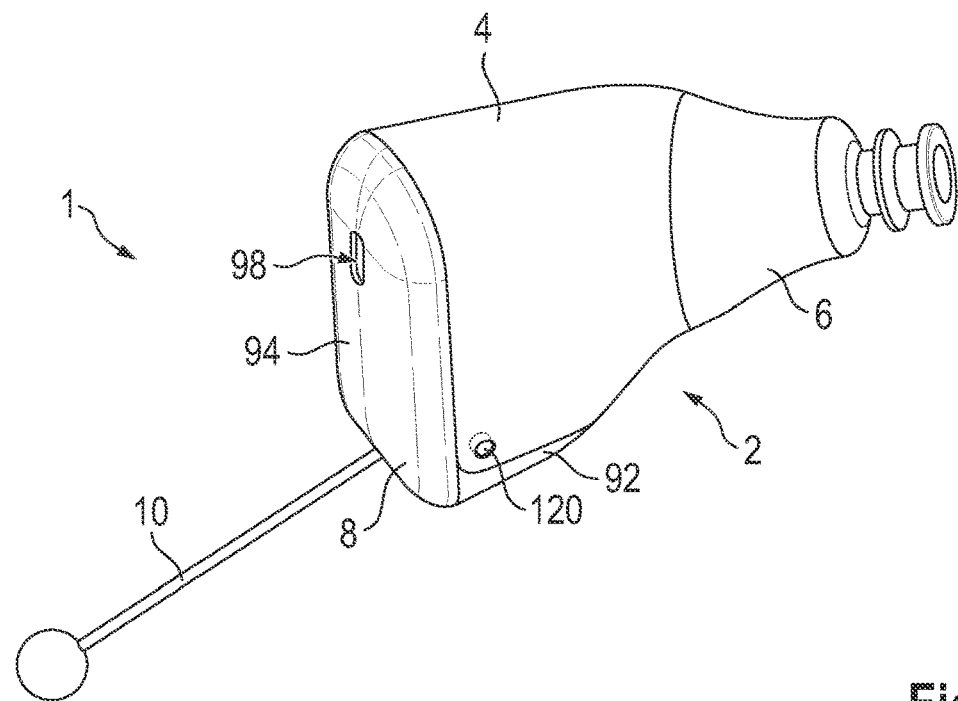
FIG. 1 shows, schematically, a perspective view of a hearing instrument to be worn in the ear canal.

FIG. 1 shows, schematically, a hearing instrument that is configured and intended to be worn in the ear canal, and is therefore referred to below as the ITE (for "in the ear"). The ITE 1 has an outer housing 2, which, in the present exemplary embodiment, is formed by several housing elements. One housing element forms a main housing 4 (also referred to as a housing center part), another housing element forms a housing tip 6 facing the eardrum, in the intended wearing state, and a third housing element forms a housing cover 8 that faces or is arranged at the outer end of the ear canal, in the intended wearing state. A wax guard and an earpiece (also referred to as a "dome") are not depicted in detail in FIGS. 1 to 12. In addition, the ITE 1 has a drawstring 10 attached to the housing cover 8.

Figure 2:
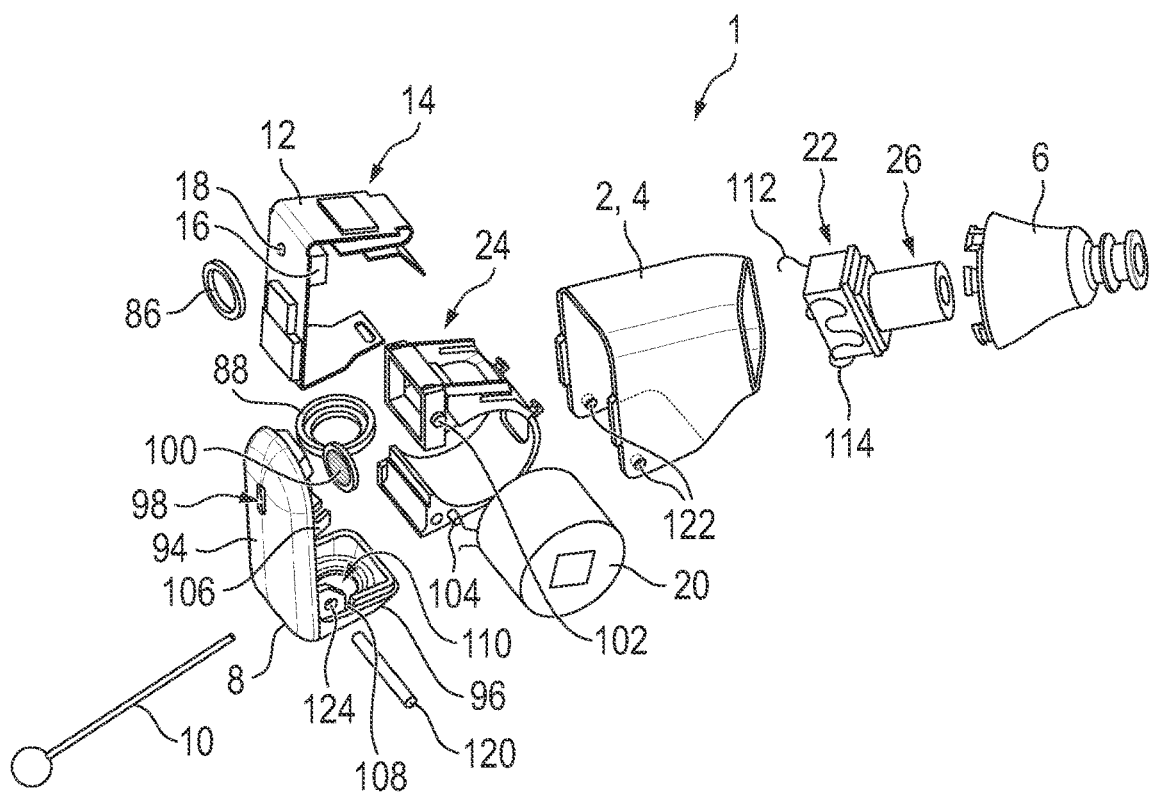
FIG. 2 shows, schematically, an exploded view of the hearing instrument.

FIG. 2 shows, schematically, further components of the ITE 1. The ITE 1 comprises a circuit carrier (referred to as "PCB 12" for short) on which electronic components are arranged in the form of a chipset 14 comprising several integrated circuits and electronic components (see FIGS. 4, 5). Furthermore, a microphone 16 is arranged on the PCB 12, and, with a sound inlet opening which is not shown, is arranged congruently with a sound hole 18 in the PCB 12. In addition, the ITE 1 has a rechargeable battery 20 and a speaker 22. The battery 20 is associated with a mechanical holder (abbreviated to "frame 24") in which the battery 20 is accommodated in a manner explained in greater detail below. In addition, the ITE 1 also comprises an MI antenna 26 that is configured for magneto-inductive communication between two ITE 1s in the context of a binaural hearing system. This MI antenna 26 is located on a speaker output channel ("spout", not shown). For charging the rechargeable battery 20, the ITE 1 also has a charging contact arrangement 28 (see FIG. 5). The arrangement of these components, as well as other components, is described in greater detail below.

Figure 3:
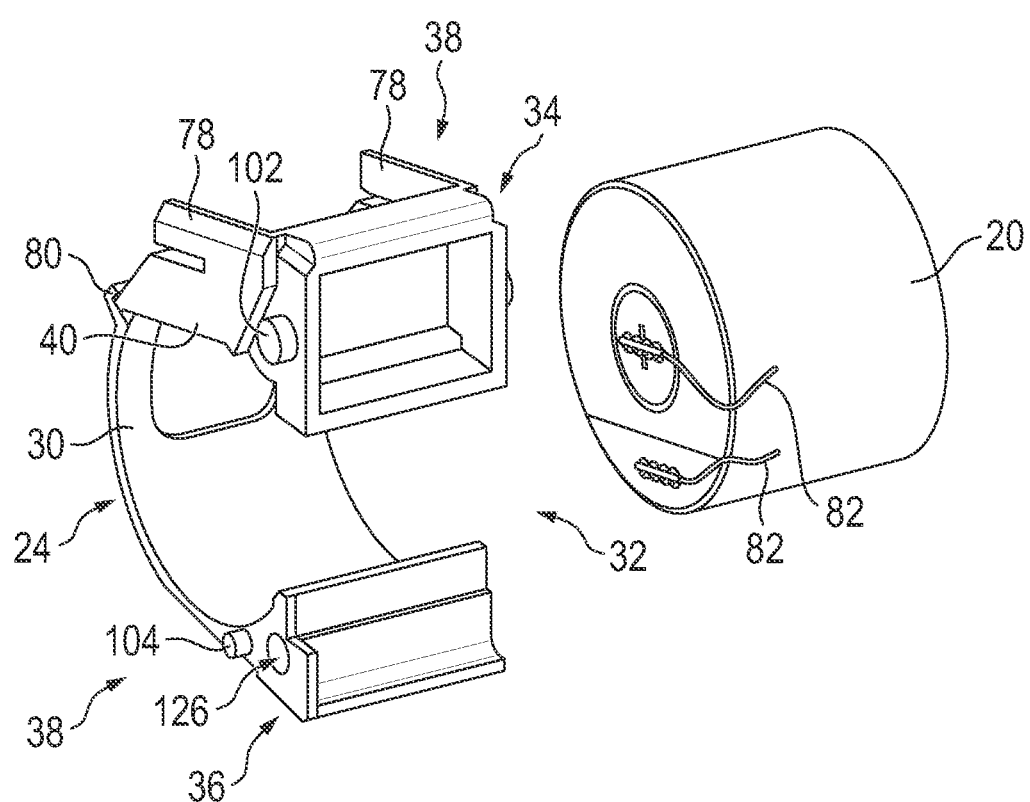
FIG. 3 shows, schematically, a perspective view of a battery cell of the hearing instrument and a mechanical holder for said battery cell.

FIG. 3 depicts the frame 24 in greater detail. The frame 24 is roughly C-shaped, i.e. comprises an annular body 30 describing approximately a three-quarter circle, which is interrupted by an annular opening 32. Attachment structures 38, described in greater detail below, are formed at the upper and lower ends 34 and 36 of the annular body 30, which are opposite each other, across the annular opening 32. The annular body 30 is dimensioned such that the battery 20 can be inserted axially into the annular body 30, preferably with slight clamping. The frame 24 thus forms a clamp for the battery 20. To secure the battery 20 axially in the insertion direction, i.e. as an axial stop, the attachment structures 38 of the upper end 38 have a radially inwardly projecting shoulder 40 against which the battery 20 rests when mounted in the frame 24. The battery 20 has a circular cylindrical shape, comparable to a button cell.

Figure 4:
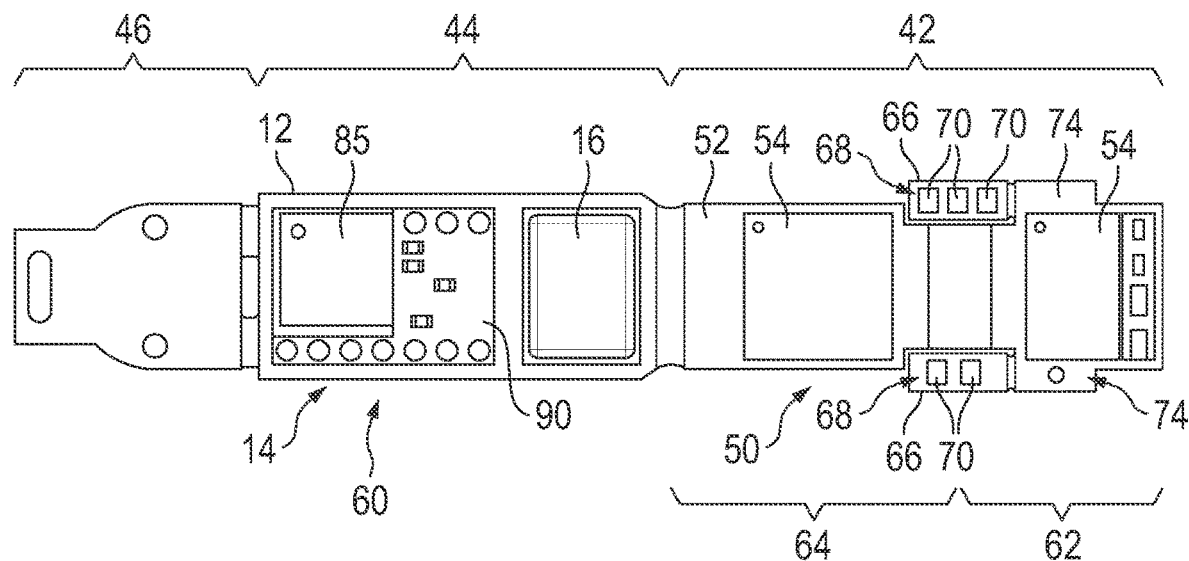
FIGS. 4 to 7 show, schematically, views of a circuit carrier of the hearing instrument in partially different assembly states.
Figure 5:
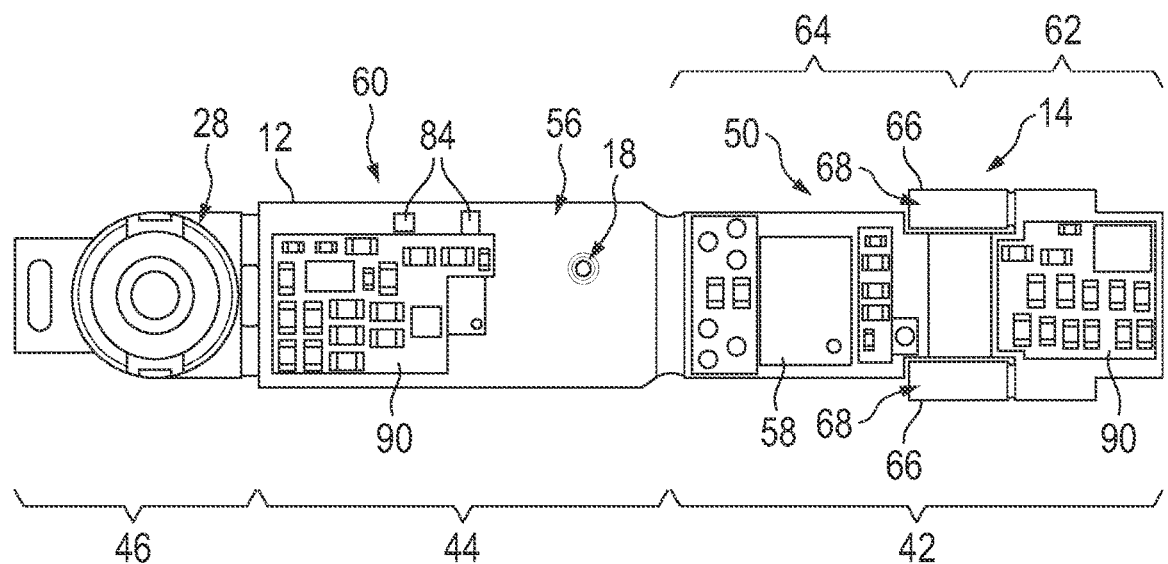
Figure 6:
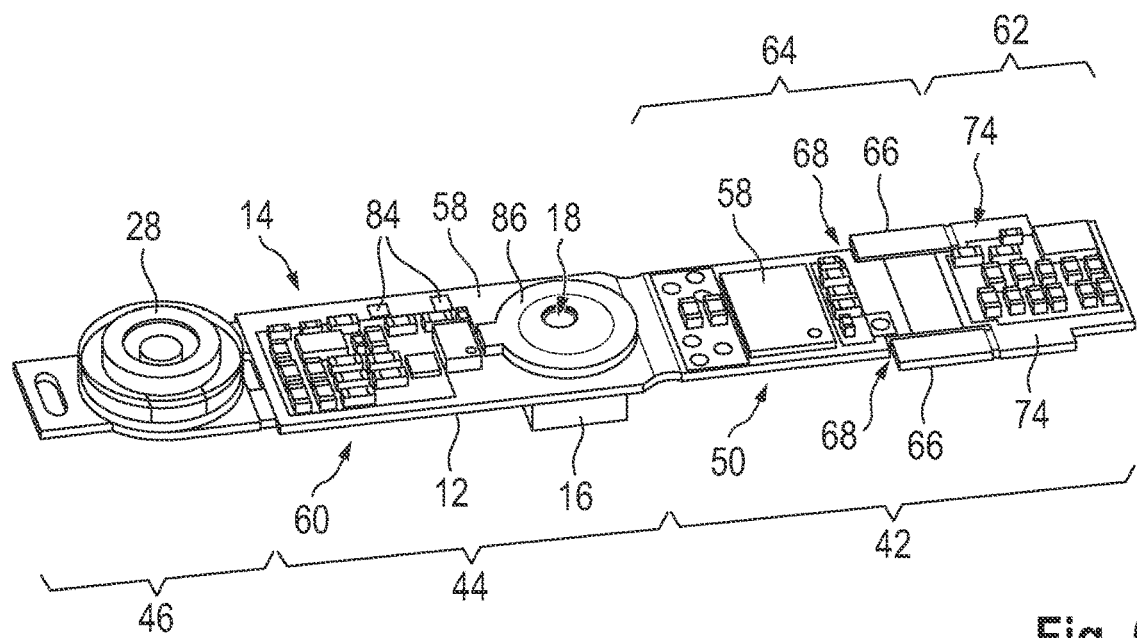

The PCB 12 is shown in FIGS. 4 and 5 in an intermediate production step. The PCB 12 is roughly strip-shaped, i.e. comparatively long and narrow and in particular without significant tapers. The PCB 12 is divided into a first end region 42, a center region 44 adjoining the first end region 42, and a second end region 46 adjoining the center region 44 on the side opposite the first end region 42. The chipset 14 is also subdivided. A portion of the chipset 14 forming an audio processor 50 is arranged in the first end region 42. For this purpose, two chips 54 are arranged here on a later "inside" 52, and a memory chip 58 is arranged on a later "outside" 56. In the center region 44, the chipset 14 forms power management electronics 60. The microphone 16 is interposed between said electronics and the audio processor 50 on the inner side 52. The charging contact arrangement 28 is arranged on the outside in the second end region 46.

The first end region 42 is further subdivided into an end section 62 (strip section) and a subsection 64 facing the center region 44 (further strip section). On the edge side of the subsection 64, two contact strips 66 (secondary strip sections) are machined out of the PCB 12 by means of an L-shaped slot 68. Each of these contact strips 66 carries several solder pads 70.

Figure 7:
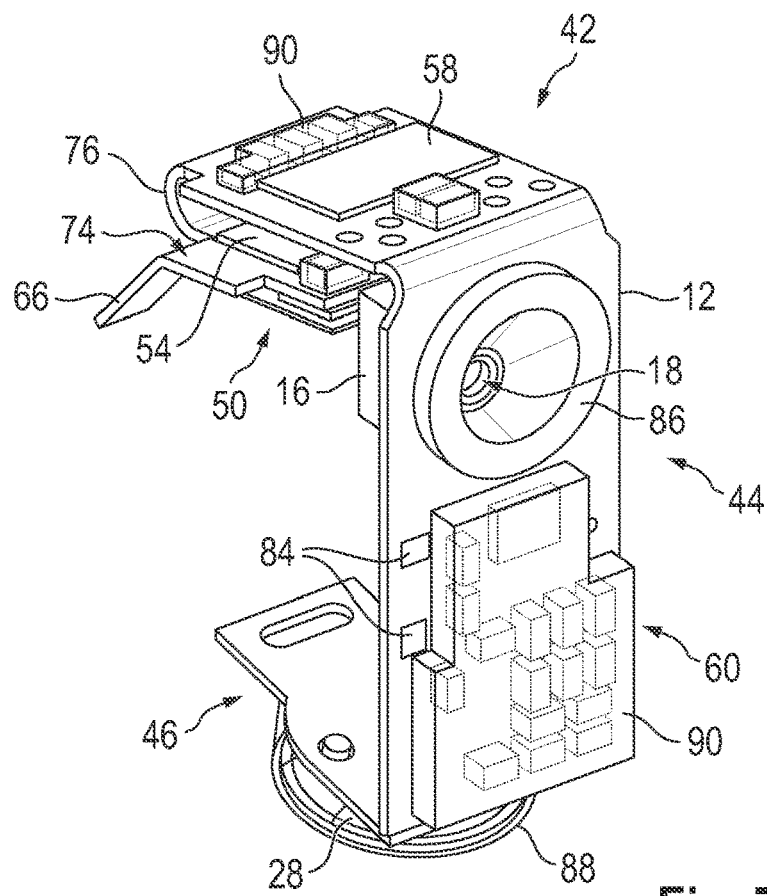
Figure 8:
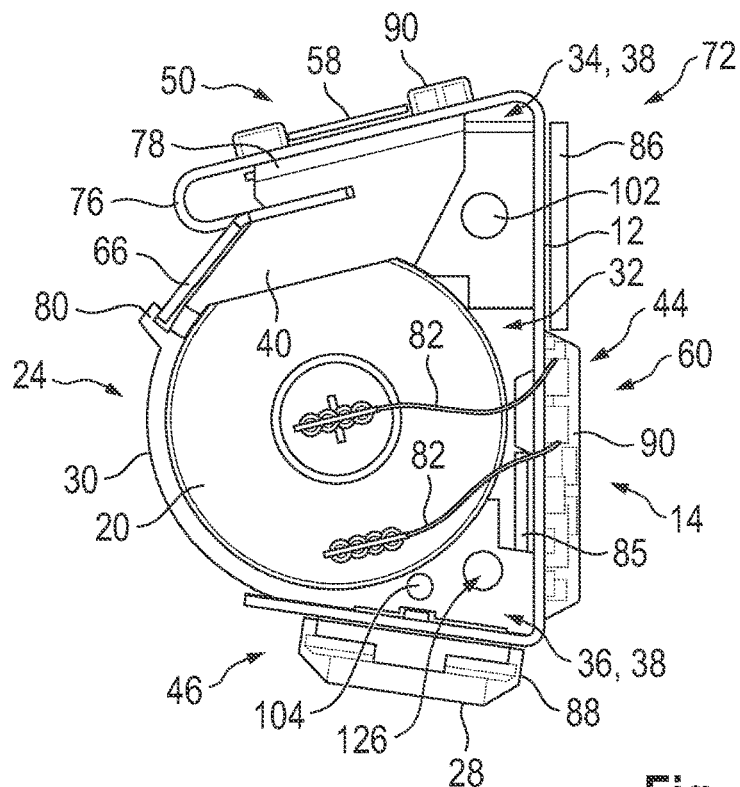
FIG. 8 shows, schematically, a side view of an electronic module of the hearing instrument formed by the battery cell, the holder, and the circuit carrier.
Figure 9:
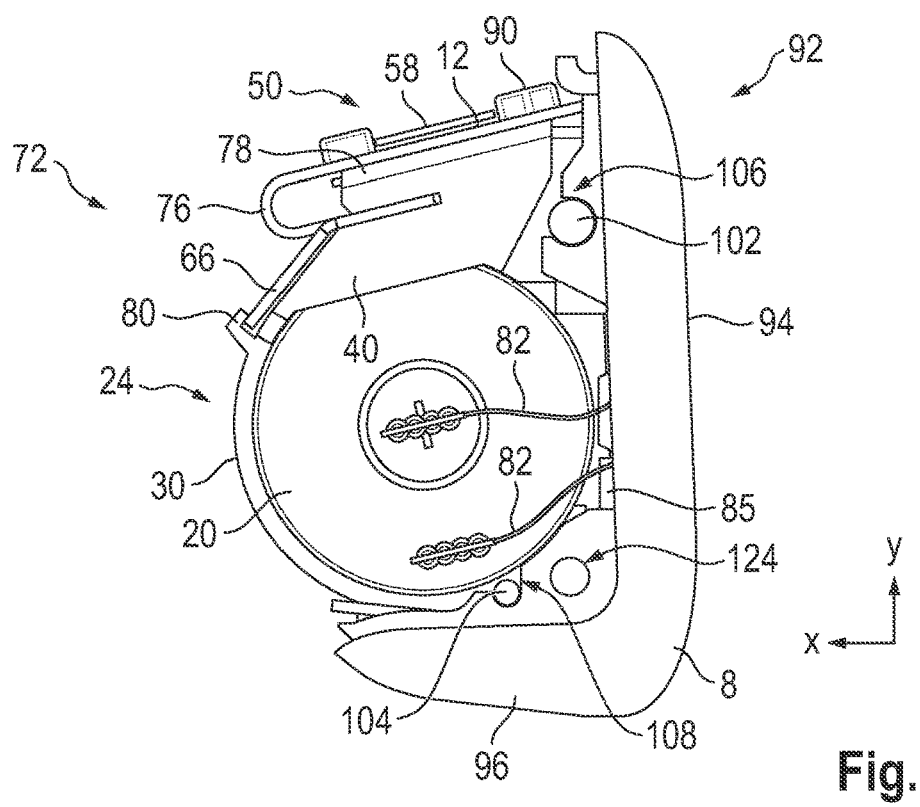
FIG. 9 shows, schematically, in the view according to FIG. 8, a basic module of the hearing instrument formed by the electronic module and a housing element.
Figure 10:
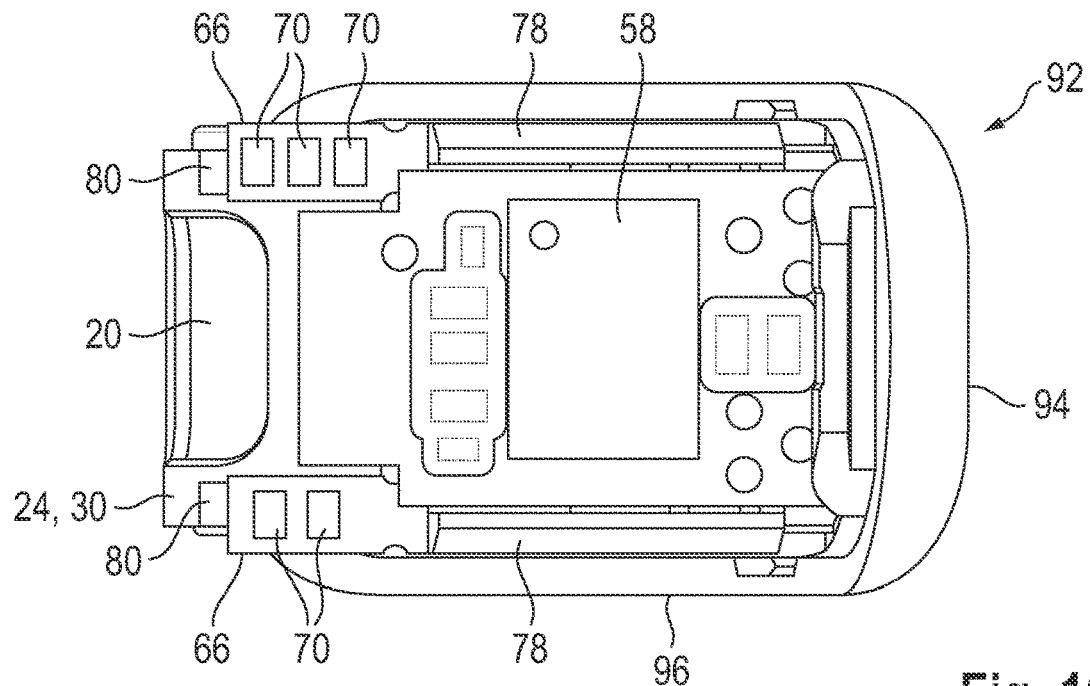
FIG. 10 shows, schematically, a top view of the basic module.

Referring to FIGS. 7 and 8, it is depicted, schematically, how an electronic module 72 is formed from the frame 24, the battery 20, and the PCB 12. To do this, the end section 62 of the PCB 12 is folded over towards the inner side 52 so that the two chips 54 rest with their backs against each other. In the region of the chips 54, the end section 62 and the subsection 64 are glued together, in such a way that a hooking region (or edge strip 74) remains without adhesive at the edge. A hook-like structure is formed by folding over the end section 62. The contact strips 66 overhang a folded edge 76 running between the end section 62 and the subsection 64. In addition, the PCB 12 is bent (folded) into an approximately C-shaped form at each transition from the center region 44 to the respective end region 42 or 46.

The battery 20 is inserted into the frame 24. The frame 24 comprises a hooking structure at the upper end 34 as part of the attachment structures 38, in the form of two frame webs 78 that are directed away from the annular opening 32 and thus form an undercut. The PCB 12 is pushed (held) into this undercut, specifically the gap between the respective frame web 78 (and the annular body 30), with the respective edge strip 74, and is thus secured in the tangential direction towards the annular opening 32.

The contact strips 66 are bent toward the battery 20 and hooked under a respective associated retaining lug 80 of the attachment structures 38 of the upper end 34 of the annular body 30, and thereby secured.

The center region 44 of the PCB 12 is placed over the annular opening 32, and the second end region 46 is placed over the lower end 36 of the frame 24. In addition, the second end region 46 is glued to the lower end 36 and is thus fixed to the frame 24. This bending and wrapping of the PCB 12 around the frame 24 loads the latter in the "closing" direction, i.e., applies a clamping action to the battery 20 or increases the clamping action that may already exist. At the very least, the frame 24 is secured against bending open, so that the battery 20 cannot fall out unintentionally.

Contact leads 82 of the battery 20 are then connected, specifically soldered, to corresponding contact terminals (solder pads 84) of the PCB 12 associated with the power distribution electronics 60.

As can be seen from FIG. 8, the battery 20 is at least partially located on an imaginary direct connecting line between the power management electronics 60 and the audio processor 50. At the very least, the battery 20 is arranged between a chip 85 (in particular a PMIC) of the power management electronics 60 and the audio processor 50, specifically the chips 54 thereof. Advantageously, this allows the battery 20 to act as a shield between these chips 54 and 85, respectively, so that electromagnetic interference with the audio processor 50 is avoided or reduced.

Furthermore, a ring seal ("microphone seal 86") is arranged on the PCB 12 in the area around the sound hole 18, and a further ring seal ("sealing ring 88") is arranged around the charging contact arrangement 28, in particular glued to the PCB 12. As shown in FIGS. 4, 5, and 7, the electronic components of PCB 12 are also coated with a casting resin 90 (depicted as transparent).

Together with the housing cover 8 and the electronic module 72, a basic module for the ITE 1 is formed. The housing cover 8 is L-shaped, with a long leg 94 and a short leg 96 that is angled at approximately 85 degrees to the long leg 94. A microphone opening 98 is arranged in the long leg 94, corresponding to the sound hole 18 and the microphone seal 86 to connect the microphone 16 to the environment in a fluid manner. On the inside, a protective mesh 100, specifically a monofilament mesh, is arranged in front of the microphone opening 98 (see FIG. 1). Furthermore, the drawstring 10 is glued into the housing cover 8.

First and second positioning aids are formed on the frame 24 and the housing cover 8, respectively, to connect the electronic module 72 to the housing cover 8. The first and second positioning aids of the frame 24 are part of the attachment structures 38 and are formed as a latching pin 102 (first positioning aid) and a positioning pin 104 (second positioning aid). An approximately C-shaped clamp 106 is formed at the long leg 94 as a first positioning aid. A U-shaped groove 108 is formed on the short leg 96 of the housing cover 8 as a second positioning aid. During assembly, the electronic module 72 is first inserted into the groove 108 with the positioning pin 104, said groove preventing the electronic module 72 from moving in an x-direction, and said electronic module is then clipped (latched) into the clamp 106 with the latching pin 102. The latter prevents a displacement in the y-direction. The clipping (latching) is per-formed by compressing both the microphone seal 86 and the sealing ring 88 between the PCB 12 and the housing cover 8. The sealing ring 88 surrounds a charging opening 110 in the short leg 96 of the housing cover 8 (see FIG. 1), so that the charging contact arrangement 28 is accessible from the outside.

The basic module 92 thus constitutes a stable intermediate production module. Said module is then connected to the remaining components of the ITE 1.

For this purpose, the loudspeaker 22 (with the MI antenna 26 arranged thereon) is first inserted into the housing tip 6, specifically, is glued in a sealing manner around a sound outlet opening of the housing tip 6. The housing tip 6 is then clipped into the main housing 4.

Two-pole contact leads 112 of the MI antenna 26 and three-pole contact leads 114 of the speaker 22 are contacted, specifically soldered (not shown in detail), to the solder pads 70 arranged on the contact strips 66.

Figure 11:
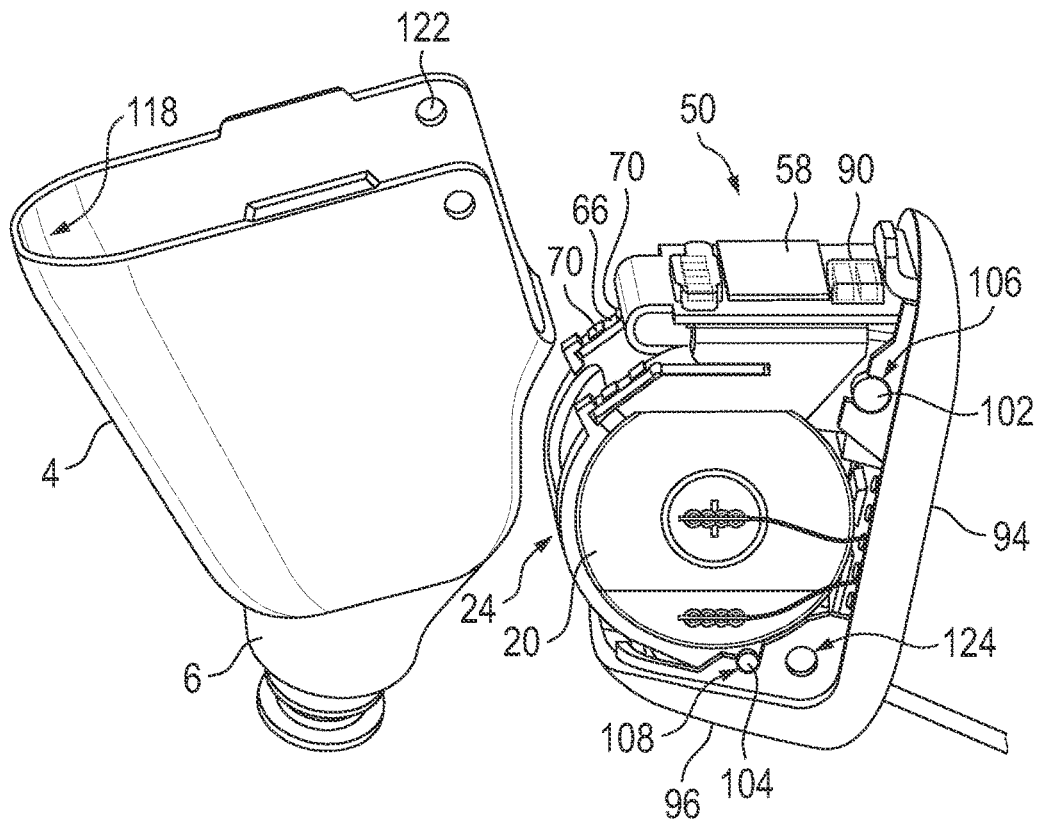
FIG. 11 shows, schematically, in a view according to FIG. 8, the basic module and a main housing of the hearing instrument in an intermediate production state.
Figure 12:
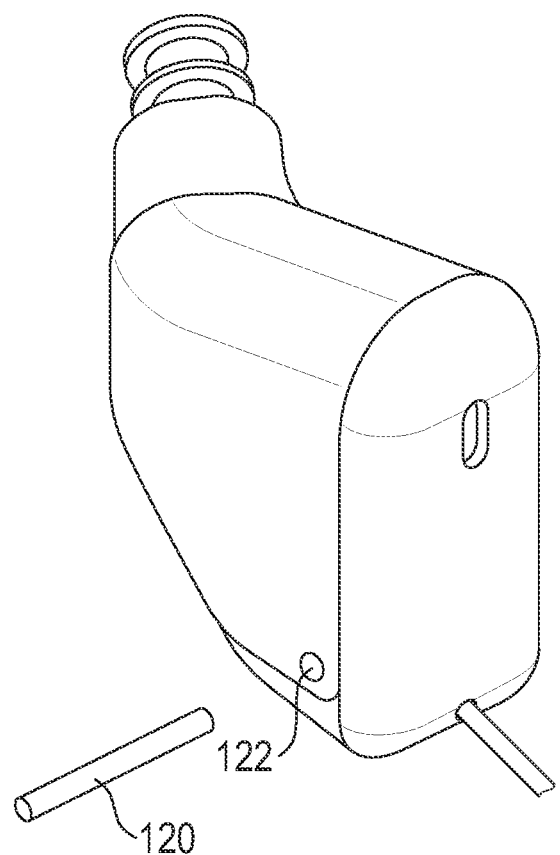
FIG. 12 shows, schematically, another perspective view of the hearing instrument.

The base module 12 is then inserted into a corresponding groove 118 in the main housing 4 by means of a hook 116 formed on the housing cover 8, specifically on the free end of the long leg 94, and then swiveled into the main housing 4 with the short leg 96 leading (see FIG. 11). A locking pin 120 is then inserted through an attachment hole 122 in the main housing 4. The locking pin 120 passes through a corresponding hole 124 of the housing cover 8 and through a bolting eye 126 of the frame 24 (which in turn is part of the attachment structures 38), whereby the frame 24, the housing cover 8, and the main housing 4 are secured to each other by only one common connecting element.

The above-described interaction of the first and second positioning aids of the frame 24 and the housing cover 8 not only holds these two parts together, but also positions the bolting eye 126 and the hole 124 in alignment with each other. This simplifies the assembly of the locking pin 120.

In addition to the use of the battery 20 as a shield in the intended assembly state described above, the positioning of the charging contact arrangement 28 in the second end region 46, the power management electronics 60 in the center region 44, and the audio processor 50 in the first end region 42 also has the ad-vantage that a power flow is advantageously designed. During charging, charging power is supplied from the charging contact arrangement 28 to the power management electronics 60 (which also assumes the function of charging electronics) via a path that is short compared to the length of the PCB 12, and from said power management electronics to the battery 20, also via a short path. In the "audio mode" of the ITE 1, the "branch" to the charging contact arrangement is inactive, and power is supplied from the battery 20 via the power management electronics 60 as operating power to the microphone 16 and the audio processor 50, and indirectly via the latter to the speaker 22.

The subject matter of the present invention is not limited to the exemplary embodiment described above. Rather, additional specific embodiments of the present invention may be derived from the above description by those skilled in the art.

LIST OF REFERENCE SIGNS

1 ITE
2 Outer housing
4 Main housing
6 Housing tip
8 Housing cover
10 Drawstring
12 PCB
14 Chipset
16 Microphone
18 Sound hole
20 Battery
22 Loudspeaker
24 Frame
26 MI antenna
28 Charging contact arrangement
30 Annular body
32 Annular opening
34 End
36 End
38 Attachment structure
40 Shoulder
42 End region
44 Center region
46 End region
50 Audio processor
52 Inner side
54 Chip
56 Outer side
58 Memory chip
60 Power management electronics
62 End section
64 Subsection
66 Contact strip
68 Slot
70 Solder pad
72 Electronic module
74 Edge strip
76 Folded edge
78 Frame web
80 Retaining lug
82 Contact lead
84 Solder pad
86 Microphone seal
88 Sealing ring
90 Casting resin
92 Basic module
94 Leg
96 Leg
98 Microphone opening
100 Protective mesh
102 Latching pin
104 Positioning pin
106 Clamp
108 Groove
110 Charging opening
112 Contact lead
114 Contact lead
116 Hook
118 Groove
120 Locking pin
122 Attachment hole
124 Hole
126 Bolting eye

The invention claimed is:

1. An electronic module for a hearing instrument to be worn in the ear canal, the electronic module comprising:
a rechargeable battery;
a circuit carrier; and
a chipset arranged on said circuit carrier, said chipset forming an audio processor and power management electronics;
and wherein:
in an intended assembly state, said circuit carrier is wrapped, in sections and bent, around said rechargeable battery, and said rechargeable battery is at least partially arranged between said audio processor and said power management electronics;
said circuit carrier is a strip with a first end region in which said audio processor is arranged, a center region delimited from said first end region in a longitudinal direction of said strip, and a second end region adjoining said center region and opposite said first end region;
said circuit carrier being formed without substantial tapering between said first end region and said center region and between said center region and said second end region;

said power management electronics is arranged in a section of said center region that faces said second end region; and said power management electronics comprises at least one chip that is shaded by said battery with respect to said audio processor.

2. The electronic module according to claim 1, wherein said circuit carrier is angled at a respective transition between said first end region and said center region, and between said center region and said second end region, and said circuit carrier is wrapped in part around a mechanical holder in which said rechargeable battery is accommodated.

3. The electronic module according to claim 1, wherein said at least one chip of said power management electronics is shaded by said battery relative to one or a plurality of chips of said audio processor.

4. The electronic module according to claim 1, further comprising a charging contact arrangement for charging said rechargeable battery, said charging contact arrangement being disposed on said circuit carrier on a side facing away from said rechargeable battery.

5. The electronic module according to claim 3, wherein said charging contact arrangement is arranged across from said rechargeable battery, opposite said audio processor.

6. The electronic module according to claim 5, wherein said charging contact arrangement is arranged in said second end region of said circuit carrier.

7. The electronic module according to claim 5, wherein said power management electronics is configured to supply charging power to said rechargeable battery during a charging process, and to supply operating power from said rechargeable battery to said audio processor during an operation of the hearing instrument.

8. A hearing instrument to be worn in the ear canal, the hearing instrument comprising:

a main housing formed with a housing opening which, in an intended wearing state of the hearing instrument, faces away from an ear-drum bounding the ear canal; and an electronic module according to claim 1 inserted in said main housing.

* * * * *